US007265386B2

United States Patent
Chen et al.

(10) Patent No.: US 7,265,386 B2
(45) Date of Patent: Sep. 4, 2007

(54) THIN FILM TRANSISTOR ARRAY SUBSTRATE AND METHOD FOR REPAIRING THE SAME

(75) Inventors: Chin-Sheng Chen, Luodong Township, Yilan County (TW); Chih-Hung Liu, Taoyuan (TW); Chien-Hsing Hung, Dayuan Township, Taoyuan County (TW); Kun-Yuan Huang, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/214,758

(22) Filed: Aug. 29, 2005

(65) Prior Publication Data

US 2007/0045625 A1    Mar. 1, 2007

(51) Int. Cl.
*H01L 29/04* (2006.01)
*G02F 1/13* (2006.01)

(52) U.S. Cl. .................. 257/59; 257/72; 257/E21.596; 257/E21.131; 349/192; 349/141; 349/143; 349/54

(58) Field of Classification Search .................. 257/59, 257/72, E21.596, E21.131; 349/141, 143, 349/192, 54
See application file for complete search history.

(56) References Cited

U.S. PATENT DOCUMENTS

| 4,894,690 A | 1/1990 | Okabe et al. .................. 357/4 |
| 6,809,335 B2* | 10/2004 | Park ............................. 257/59 |
| 2002/0149020 A1* | 10/2002 | Jung et al. ..................... 257/72 |
| 2004/0169781 A1 | 9/2004 | Lee et al. ....................... 349/54 |

* cited by examiner

*Primary Examiner*—Long K. Tran
(74) *Attorney, Agent, or Firm*—J.C. Patents

(57) ABSTRACT

A thin film transistor array substrate and method for repairing the same are provided. Repairing lines are formed when the data lines on the thin film transistor array substrate are defined. Furthermore, the protruding portions and branches of common lines overlap with the repairing lines and the data lines respectively. The repairing method includes performing a laser welding operation to connect the common line with the data line, the repairing line or a scan line as well as removing a portion of the lines by laser. Thus, the thin film transistor array substrate and repairing method thereof can repair line defects and increase the manufacturing yield.

3 Claims, 4 Drawing Sheets

THIN FILM TRANSISTOR ARRAY SUBSTRATE AND METHOD FOR REPAIRING THE SAME

BACKGROUND OF THE INVENTION

1. Field of the Invention

The present invention relates to an array substrate and method for repairing the same. More particularly, the present invention relates to a thin film transistor array substrate and method for repairing the same.

2. Description of the Related Art

To fit into our modern lifestyle, the size and weight of video or imaging equipment are decreasing at a phenomenal pace. Although the conventional cathode ray tube (CRT) displays still have some advantages, bulkiness and high operating power are some major factors that render its replacement by more versatile device inevitable. Nowadays, thin film transistor liquid crystal displays (TFT-LCD) have gradually become the mainstream display products in the market because of its high picture quality, high spatial utilization, lower power rating and radiation free operation.

A thin film transistor array substrate is a display device with a glass substrate. The glass substrate has a first metallic layer (a gate layer), a first dielectric layer (a gate insulating layer), a semiconductor layer, a second metallic layer (a source/drain layer) and a second dielectric layer (a passivation layer) formed thereon. Furthermore, a plurality of data lines, a plurality of scan lines, a plurality of common lines, a plurality of thin film transistors (each transistor having a gate, a semiconductor island structure and a source/drain) and a plurality of pixel electrodes are formed on the substrate. The gate connects electrically with the scan lines and the source/drain connects electrically with the data lines and the pixel electrodes. The scan lines and the common lines are part of the first metallic layer, for example. The semiconductor island structure is part of the semiconductor layer and the data lines are part of the second metallic layer. In addition, the scan lines are electrically isolated from their corresponding data lines through the first dielectric layer. Moreover, the second dielectric layer also covers the data lines.

In the process of fabricating the thin film transistor array substrate, dot defects or line defects are frequently produced. The most common conditions that result from line defects includes a broken common line, a short circuit between the common line and the data line, a broken scan line and a broken data line. When the aforementioned line defects occur in the thin film transistor array substrate, there will be a significant drop in the yield if the abnormal portion is not repaired. Hence, a systematic method for repairing such line defects is an important topic in the manufacturing of liquid crystal displays.

SUMMARY OF THE INVENTION

Accordingly, at least one objective of the present invention is to provide a thin film transistor array substrate with the capacity for repairing any line defects including broken common lines, short-circuited common lines and data lines, broken scan lines and broken data lines therein. Ultimately, the production yield of the thin film transistor array substrate is increased.

At least a second objective of the present invention is to provide a method of repairing the aforementioned thin film transistor array substrate. The repairing method repairs a thin film transistor array substrate with line defects including broken common lines, short-circuited common lines and data lines, broken scan lines or broken data lines so that the production yield is increased.

To achieve these and other advantages and in accordance with the purpose of the invention, as embodied and broadly described herein, the invention provides a thin film transistor array substrate. The thin film transistor array substrate mainly comprises a substrate, a plurality of scan lines, a plurality of data lines, a plurality of common lines, a plurality of thin film transistors, a plurality of pixel electrodes and a plurality of repairing lines. The scan lines and the data lines are disposed on the substrate. These scan lines and data lines define an array of pixel areas on the substrate. The common lines and the scan lines are aligned in parallel and disposed alternately with respect to each other. Each thin film transistor is disposed inside a corresponding pixel area and driven by a corresponding scan line and data line. Each pixel electrode is disposed within a corresponding pixel area and is electrically connected to a corresponding thin film transistor. Each repairing line is at least positioned above a scan line and laid alternately with the data line. Furthermore, the ends of each repairing line overlap partially with the two adjacent common lines on the respective sides of the scan line.

According to the aforementioned thin film transistor array substrate in the preferred embodiment of the present invention, the respective sides of each common line have a plurality of outward extending branches. Furthermore, each branch is next to a corresponding data line.

According to the aforementioned thin film transistor array substrate in the preferred embodiment of the present invention, the respective ends of each repairing line overlap with the branches of the corresponding common line.

According to the aforementioned thin film transistor array substrate in the preferred embodiment of the present invention, the repairing lines and the data lines are fabricated in the same manufacturing process, for example.

The present invention also provides a method for repairing a thin film transistor array substrate, in particular, the aforementioned thin film transistor array substrate. The thin film transistor array substrate has a defect. The defect results in a break in a common line. The repairing method includes electrically connecting the common lines at the two ends of the defect to a first repairing line and a second repairing line and then electrically connecting the first repairing line and the second repairing line to another common line.

The present invention also provides another method for repairing a thin film transistor array substrate, in particular, the aforementioned thin film transistor array substrate. The thin film transistor array substrate has a defect. The defect results in a short circuit between a data line and a common line. The repairing method includes electrically isolating the common lines at the two ends of the defect and then electrically connecting the common lines at the two ends of the defect to a first repairing line and a second repairing line. Thereafter, the first repairing line and the second repairing line are electrically connected through another common line.

The present invention also provides yet another method for repairing a thin film transistor array substrate, in particular, the aforementioned thin film transistor array substrate. The thin film transistor array substrate has a defect. The defect results in a break in a scan line. The repairing method includes electrically connecting the scan lines at the two ends of the defect to a first repairing line and a second repairing line and then electrically connecting the first repairing line and the second repairing line to a common line. Thereafter, a portion of the common line is electrically isolated to form a replacement line. The replacement line is electrically connected to the first repairing line and the second repairing line.

According to the aforementioned thin film transistor array substrate in the preferred embodiment of the present invention, each branch of the common lines has a protruding portion that extends to an area above a corresponding data line and overlaps with part of the data line.

The present invention also provides a method for repairing a thin film transistor array substrate, in particular, the aforementioned thin film transistor array substrate. The thin film transistor array substrate has a defect. The defect results in a break in a data line. The repairing method includes electrically connecting the data lines at the two ends of the defect to a first branch of a first common line and a second branch of a second common line and then electrically connecting the first branch and the second branch through an repairing line. Furthermore, the first common line is electrically isolated from the first branch and the second common line is electrically isolated from the second branch.

According to the aforementioned thin film transistor array substrate in the preferred embodiment of the present invention, the method of forming an electrical isolation includes performing a laser removal process.

According to the aforementioned thin film transistor array substrate in the preferred embodiment of the present invention, the method of forming an electrical connection includes performing a laser welding operation.

In the present invention, the repairing lines required to perform repairing operations and the data lines are formed at the same time. The repairing lines are formed over at least a scan line and laid in alternate locations with respect to the data line. Furthermore, the respective ends of each repairing line overlap partly with the two adjacent common lines on the respective sides of the scan line. By combining a laser welding operation for electrically connecting a repairing line with a common line together with a laser removal operation for isolating various connections, various line defects including broken common line, short-circuited common line and data line and broken scan line can be repaired.

In addition, the branches of the common lines, each has a protruding portion in the present invention. Furthermore, the protruding portion extends to an area above a corresponding data line and overlaps partly with the data lines. During a repair operation, through a laser welding operation for electrically connecting a data line with a common line together with a laser removal operation for isolating various connections, a line defect caused by a broken data line can be repaired.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
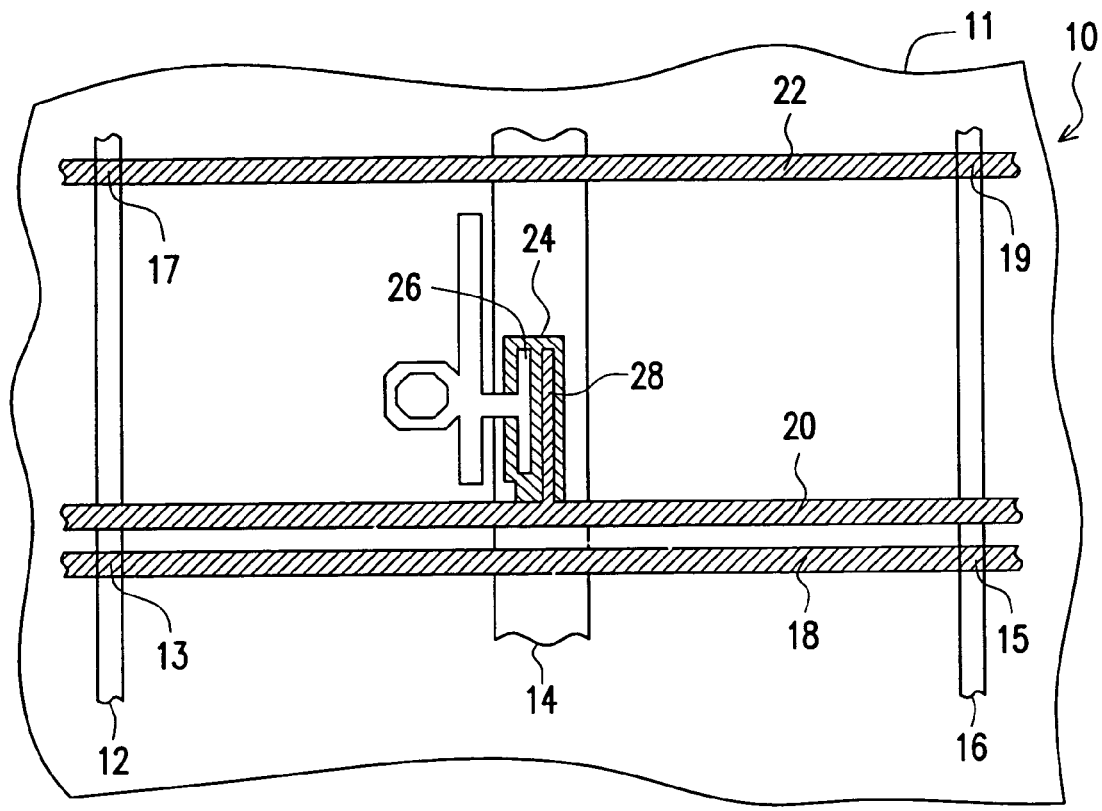
FIG. 1 is a top view showing the local structure of a thin film transistor array substrate according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In general, a thin film transistor array substrate comprises a substrate, a plurality of scan lines, a plurality of data lines, a plurality of common lines, a plurality of thin film transistors and a plurality of pixel electrodes. The scan lines and the data lines are disposed on the substrate. The scan lines and the data lines together define an array of pixel areas on the substrate. Each thin film transistor is disposed inside a corresponding pixel area and driven by a scan line and a data line. Each pixel electrode is disposed inside a corresponding pixel area and electrically connected to a corresponding thin film transistor.

FIG. 1 is a top view showing the local structure of a thin film transistor array substrate according to a first embodiment of the present invention. As shown in FIG. 1, a first common line 12, a scan line 14 and an adjacent second common line 16 of the thin film transistor array substrate 10 are disposed in parallel and alternately laid on a glass substrate 11, for example. A first repairing line 18, a data line 20 and a second repairing line 22 are alternately disposed over the glass substrate 11. The first repairing line 18 and the second repairing line 22 are disposed over the scan line 14. Furthermore, the two ends of the first repairing line 18 form partial overlaps 13 and 15 with the two adjacent common lines 12 and 16 on each side of the scan line 14. Similarly, the two ends of the second repairing line 22 form partial overlaps 17 and 19 with the two adjacent common lines 12 and 16 on each side of the scan line 14. A source 26 and a drain 28 of the thin film transistor are disposed over a semiconductor island structure 24 such that the drain 28 is electrically connected to the data line 20.

The first common line 12, the scan line 14 and the second common line 16 are part of a first metallic layer. The data line 20, the first repairing line 18 and the second repairing line 22 are part of a second metallic layer. In other words, the first common line 12, the scan line 14 and the second common line 16 can be fabricated in the same manufacturing step and the data line 20, the first repairing line 18 and the second repairing line 22 can be fabricated in the same manufacturing step. In addition, the first metallic layer and the second metallic layer are electrically isolated through a dielectric layer, for example. Therefore, under normal conditions, the scan line 14 and the data line 20 are electrically insulated from each other and the repairing lines 18, 22 and the common lines 12, 16 are also electrically insulated from each other.

Figure 2:
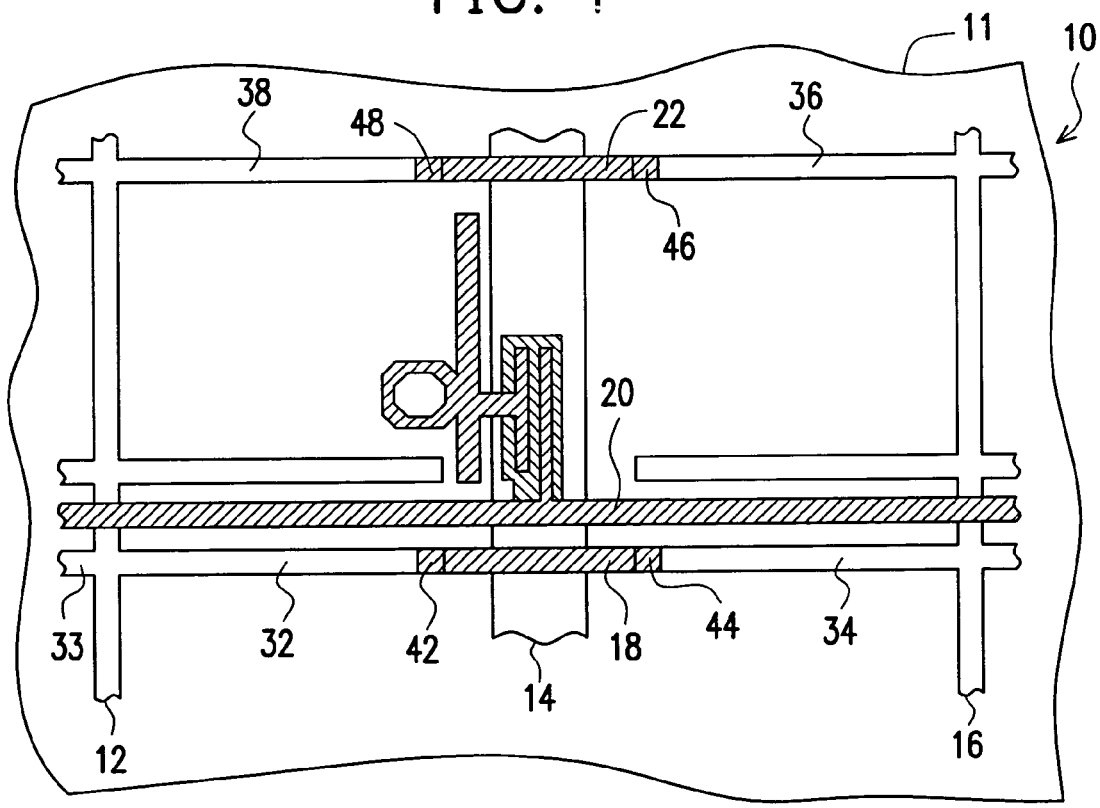
FIG. 2 is a top view showing the local structure of a thin film transistor array substrate according to a second embodiment of the present invention.

FIG. 2 is a top view showing the local structure of a thin film transistor array substrate according to a second embodiment of the present invention. As shown in FIG. 2, the structure in this embodiment is almost identical to the first embodiment except for the structural layout of the common lines. For example, one side of the first common line 12 has an outward extending first branch 32 and the other side of the first common line 12 has another branch 33. These branches are disposed next to their corresponding data line 20. Furthermore, one side of the second common line 16 has an outward extending second branch 34. The respective ends of the first repairing line 18 overlap partly with the first branch 32 and the second branch 34 to form a first overlap portion 42 and a second overlap portion 44. Similarly, the respective ends of the second repairing line 22 overlap partly with a third branch 36 and a fourth branch 38 to form a third overlap portion 46 and a fourth overlap portion 48.

Due to defects resulting from the fabrication of the thin film transistor array substrate or other factors, line defects including broken common line, short-circuited common line and data line and broken scan line may occur. In the following, a second embodiment for repairing the aforementioned line defects is disclosed. However, this method should by no means limit the scope of the present invention. An identical method is also applicable to the structure disclosed in the first embodiment.

Figure 3:
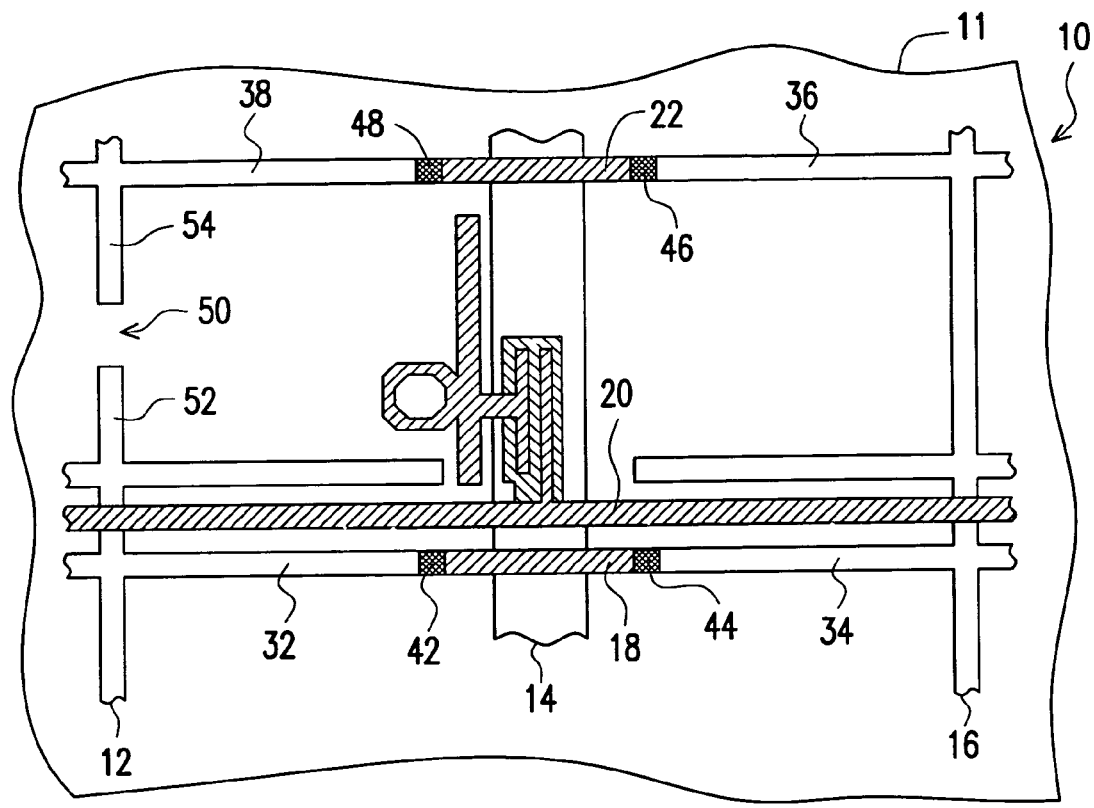
FIG. 3 is a top view of the local structure of a thin film transistor array substrate showing the method for repairing a broken common line according to the present invention.

FIG. 3 is a top view of the local structure of a thin film transistor array substrate showing the method for repairing a broken common line according to the present invention. As shown in FIG. 3, a broken spot 50 in a common line isolates the common line into a first portion 52 and a second portion 54. The first portion 52 is electrically connected to a first branch 32 and the second portion 54 is electrically connected to a fourth branch 38. The repairing method includes performing a laser welding from the back of the thin film transistor array substrate 10 to fuse the first branch 32 and the first repairing line 18 together through a first overlap portion 42. Hence, the first portion 52 is electrically connected to the first repairing line 18 through the first overlap portion 42. Similarly, the first repairing line 18 is electrically connected to the second common line 16 through a second overlap portion 44, the second common line 16 is electrically connected to the second repairing line 22 through a third overlap portion 46 and the second repairing line 22 is electrically connected to the second portion 54 through a fourth overlap portion 48 by performing a laser welding process. Therefore, the first portion 52 and the second portion 54 of the common line are repaired through the electrical connections between the first branch 32, the first repairing line 18, the adjacent second common line 16, the second repairing line 22 and the fourth branch 38.

Figure 4:
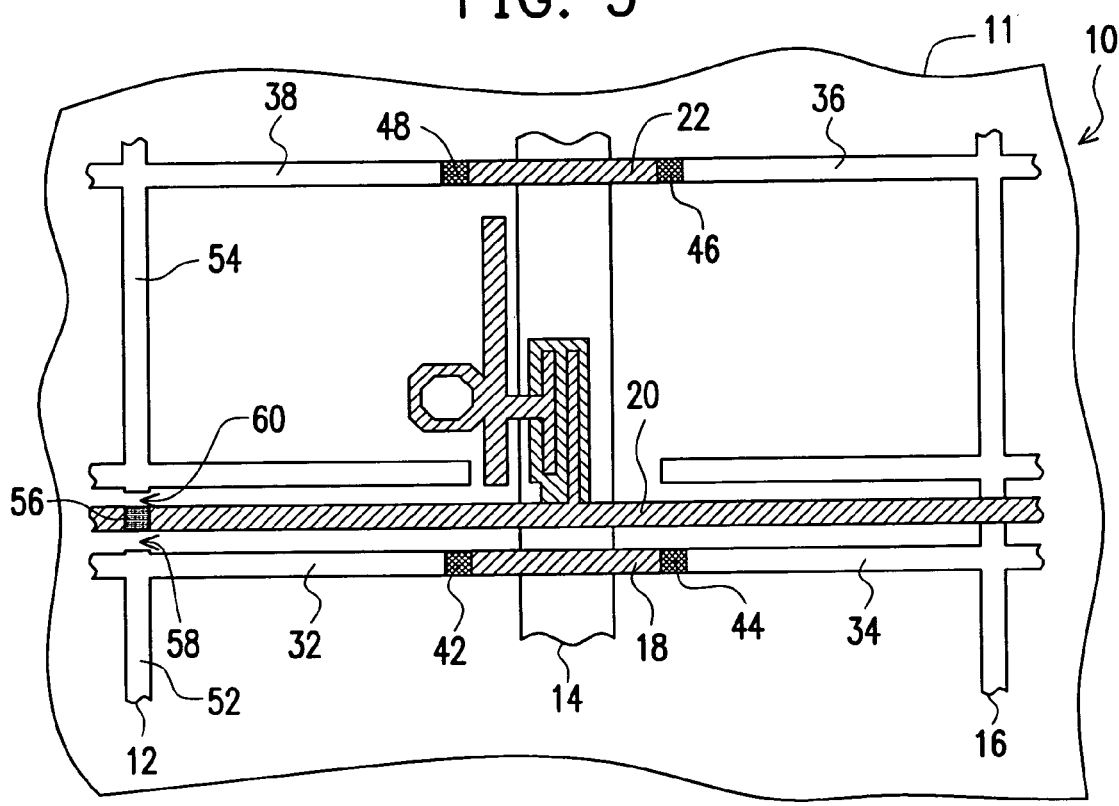
FIG. 4 is a top view of the local structure of a thin film transistor array substrate showing the method for repairing a short circuit between a common line and a data line according to the present invention.

FIG. 4 is a top view of the local structure of a thin film transistor array substrate showing the method for repairing a short circuit between a common line and a data line according to the present invention. As shown in FIG. 4, a data line 20 and a common line 12 of the thin film transistor array substrate 10 are electrically shorted at a short-circuited point 56. The repairing method includes removing some of the material at the respective ends of the short-circuited point 56 to form two cut-off points 58, 60 using laser. Through the cut-off points 58 and 60, the common line 12 and the data line 20 are electrically isolated. Furthermore, the cut-off points 58 and 60 also divide the common line 12 into a first portion 52 and a second portion 54 that are mutually isolated from each other. The first portion 52 is electrically connected to a first branch 32 and the second portion 54 is electrically connected to a fourth branch 38. In a way similar to the aforementioned method of repairing a broken common line, the first branch 32 and the first repairing line 18 can be fused together by performing a laser welding process. Hence, the first portion 52 and the first repairing line 18 is electrically connected through the first overlap portion 42. Similarly, the first repairing line 18 is electrically connected to the second common line 16 through a second overlap portion 44, the second common line 16 is electrically connected to the second repairing line 22 through a third overlap portion 46 and the second repairing line 22 is electrically connected to the second portion 54 through a fourth overlap portion 48 by performing a laser welding process. Therefore, the first portion 52 and the second portion 54 of the common line are repaired through the electrical connections between the first branch 32, the first repairing line 18, the adjacent second common line 16, the second repairing line 22 and the fourth branch 38.

Figure 5:
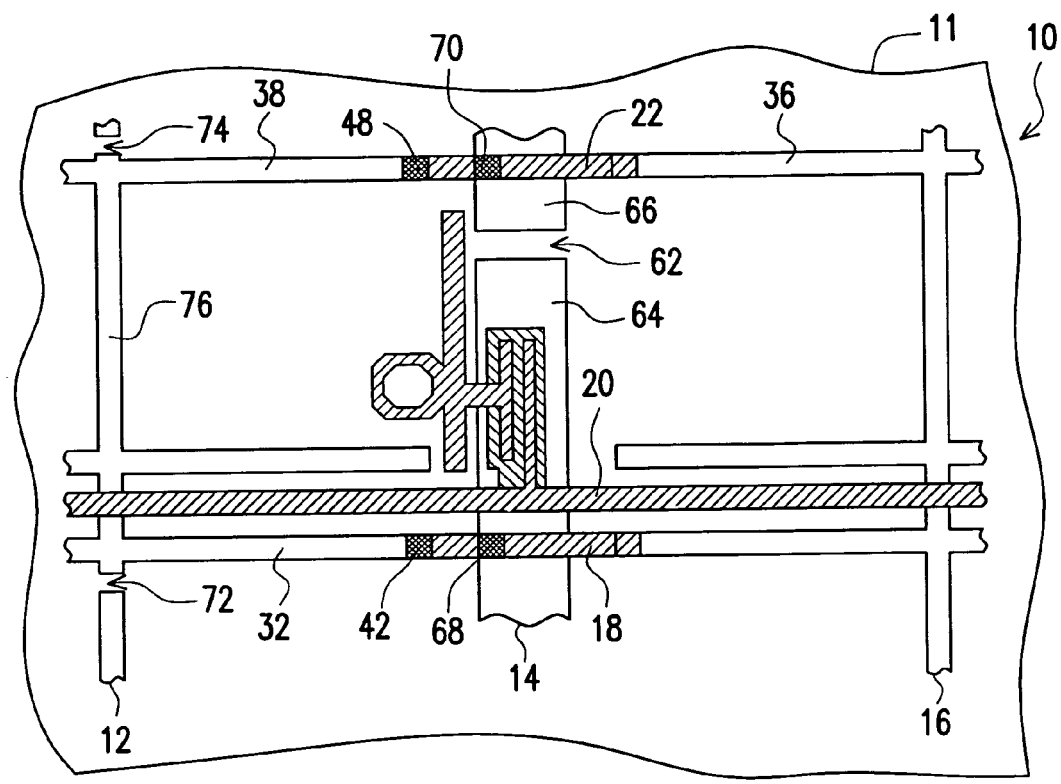
FIG. 5 is a top view of the local structure of a thin film transistor array substrate showing the method for repairing a broken scan line according to the present invention.

FIG. 5 is a top view of the local structure of a thin film transistor array substrate showing the method for repairing a broken scan line according to the present invention. As shown in FIG. 5, a scan line 14 in the thin film transistor array substrate 10 has a broken point 62. Hence, the scan line 14 is divided into a third portion 64 and a fourth portion 66 that are electrically isolated from each other. The repairing method includes performing a laser welding from the back of the thin film transistor array substrate 10 to fuse a first branch 32 and a first repairing line 18 together through a first overlap portion 42 and a third portion 64 and a first repairing line 18 together through a fifth overlap portion 68. Hence, the first branch 32 and the third portion 64 are electrically connected. Similarly, a laser welding process is performed to fuse a fourth branch 38 and the second repairing line 22 together through a fourth overlap portion 48 and a fourth portion 66 and the second repairing line 22 together through a sixth overlap portion 70. Hence, the fourth branch 38 and the fourth portion 66 are electrically connected. Thereafter, a laser removal method is deployed to form two cut points 72 and 74 on the first common line 12, thereby electrically isolating a portion of the first common line 12 and forming a replacement line 76. The replacement line 76 electrically connects the first branch 32 and the fourth branch 38 together. Therefore, the third portion 64 and the fourth portion 66 of the scan line 14 are repaired through the electrical connections between the first repairing line 18, the first branch 32, the replacement line 76, the fourth branch 38 and the second repairing line 22.

Figure 6:
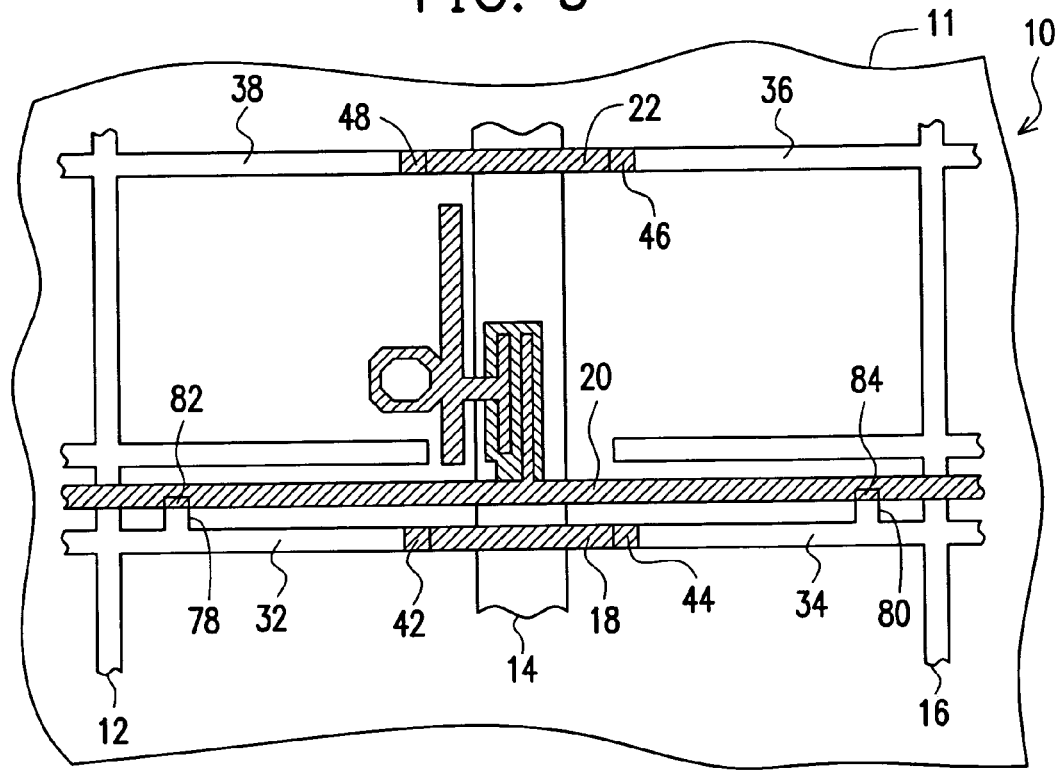
FIG. 6 is a top view showing the local structure of a thin film transistor array substrate according to a third embodiment of the present invention.

FIG. 6 is a top view showing the local structure of a thin film transistor array substrate according to a third embodiment of the present invention. As shown in FIG. 6, the present embodiment is almost identical to the second embodiment except for the structural layout of the common lines. For example, the first branch 32 and the second branch 34 have a first protruding portion 78 and a second protruding portion 80 respectively. Furthermore, these protruding portions 78 and 80 extend into areas above their corresponding data line 20 and partly overlap with the data line 20 to form a seventh overlap portion 82 and an eighth overlap portion 84.

In the following, a third embodiment for repairing a broken data line is disclosed. However, this method should by no means limit the scope of the present invention. FIG.

Figure 7:
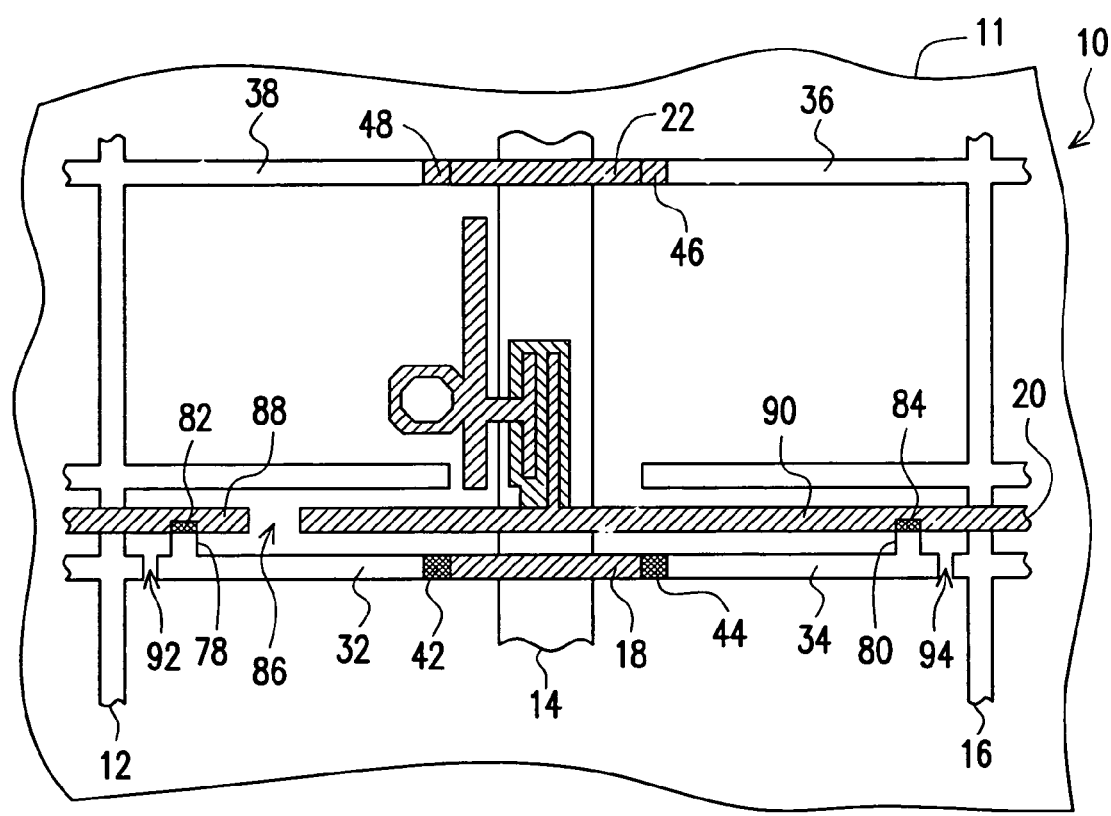
FIG. 7 is a top view of the local structure of a thin film transistor array substrate showing the method for repairing a broken data line according to the present invention.

7 is a top view of the local structure of a thin film transistor array substrate showing the method for repairing a broken data line according to the present invention. As shown in FIG. 7, a data line 20 in the thin film transistor array substrate 10 has a broken point 86. Hence, the data line 20 is divided into a seventh portion 88 and an eighth portion 90 that are electrically isolated from each other. The repairing method includes performing a laser welding from the back of the thin film transistor array substrate 10 to fuse the seventh portion 88 and a first protruding portion 78 together through a seventh overlap portion 82. Hence, the seventh portion 88 and the first branch 32 are electrically connected through the seventh overlap portion 82. Similarly, the first branch 32 and the first repairing line 18 are electrically connected through the first overlap portion 42, the first repairing line 18 and the second branch 34 are electrically connected through the second overlap portion 44 and the second branch 34 and an eighth portion 90 are electrically connected through an eighth overlap portion 84 by performing laser welding. Thereafter, a laser removal method is deployed to form two cut points 92 and 94 on the first branch 32 and the second branch 34 respectively, thereby electrically isolating the first common line 12 and the first branch 32 and electrically isolating the second common line 16 and the second branch 34. Thus, the seventh portion 88 and the eighth portion 90 of the data line 20 are repaired through the electrical connections between the first branch 32, the first repairing line 18 and the second branch 34.

It should be noted that the repairing lines in the present invention are part of the second metallic layer. In general, the repairing lines are non-transparent and disposed between various pixel areas. Consequently, the repairing lines can also serve as a black matrix to prevent any leakage of light to an adjacent display pixel and increase the color contrast of the liquid crystal display.

In summary, the thin film transistor array substrate and repairing method thereof in the present invention includes the following characteristics and advantages:

1. When a line defect such as a broken common line, a short-circuited common line and data line, a broken scan line and a broken data line occurs, the line defect can be repaired by fusing specific overlap portions and removing other sections using laser. Hence, the production yield is increased.
2. The repairing lines and the data lines belong to the same second metallic layer. Hence, the repairing lines for repairing the thin film transistor array substrate and the data lines can be fabricated together so that there is no increase in the number of processing steps. Furthermore, the repairing lines can serve a black matrix function to increase the color contrast of the liquid crystal display.
3. The branches and the protruding portions in the common lines for repairing the thin film transistor array substrate can be fabricated by changing the shape of the common line only so that there is no increase in the number of processing steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor array substrate, comprising:
    a substrate;
    a plurality of scan lines disposed on the substrate;
    a plurality of data lines disposed on the substrate such that the data lines and the scan lines together define an array of pixel areas on the substrate;
    a plurality of common lines disposed in parallel to and alternate with the scan lines on the substrate, wherein the respective sides of each common line have a plurality of outward extending branches and each branch is disposed next to a corresponding data line;
    a plurality of thin film transistors disposed inside the respective pixel areas and electrically connected to their corresponding scan line and data line;
    a plurality of pixel electrodes disposed inside the respective pixel areas and electrically connected to their corresponding thin film transistor; and
    a plurality of repairing lines disposed over at least one scan line and laid alternately with the data lines, wherein the two ends of each repairing line partly overlaps with the two adjacent common lines beside the scan line, wherein each branch has a protruding portion that extends to an area above a corresponding data line and overlaps with part of the data line.

2. The thin film transistor array substrate of claim 1, wherein the two ends of each repairing line overlap with the branch of the corresponding common lines.

3. The thin film transistor array substrate of claim 1, wherein the repairing lines and the data lines are the same film layer.

* * * * *